United States Patent
Kessels et al.

(10) Patent No.: US 7,606,430 B2
(45) Date of Patent: Oct. 20, 2009

(54) LITHOGRAPHIC APPARATUS AND DEVICE MANUFACTURING METHOD UTILIZING A MULTIPLE DICTIONARY COMPRESSION METHOD FOR FPD

(75) Inventors: Lambertus Gerardus Maria Kessels, Bladel (NL); Patricius Aloysius Jacobus Tinnemans, Hapert (NL); Remco Johannes Van Engelen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 683 days.

(21) Appl. No.: 11/214,055

(22) Filed: Aug. 30, 2005

(65) Prior Publication Data

US 2007/0045572 A1    Mar. 1, 2007

(51) Int. Cl.
G06K 9/46 (2006.01)
H04N 1/32 (2006.01)
H03M 7/00 (2006.01)

(52) U.S. Cl. .................. 382/232; 382/276; 358/426.01; 341/50

(58) Field of Classification Search ......... 382/143–149, 382/232, 233, 243, 245, 251, 276; 358/3.06, 358/3.13, 426.01–426.16; 341/50–107
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,982,553 | A | 11/1999 | Bloom et al. |
| 6,133,986 | A | 10/2000 | Johnson |
| 6,177,980 | B1 | 1/2001 | Johnson |
| 6,215,898 | B1 * | 4/2001 | Woodfill et al. ............. 382/154 |
| 6,438,556 | B1 * | 8/2002 | Malik et al. ................. 707/101 |
| 6,480,124 | B2 * | 11/2002 | Shiba .......................... 341/50 |

(Continued)

FOREIGN PATENT DOCUMENTS

WO    WO 98/33096    7/1998

(Continued)

Primary Examiner—Daniel G Mariam
Assistant Examiner—Manav Seth
(74) Attorney, Agent, or Firm—Sterne, Kessler, Goldstein & Fox P.L.L.C.

(57) ABSTRACT

A lithographic apparatus comprises an array of individually controllable elements that modulate a beam of radiation, a compressed-pattern memory that stores a compressed representation of a requested dose pattern to be formed on a substrate by the modulated beam, and a dictionary decompressor that at least partially decompresses the compressed representation. The dictionary decompressor comprises an external dictionary memory, a first dictionary decoder that at least partially decompresses at least a part of the compressed representation by extracting, from the external dictionary memory, portions of pattern data corresponding to references to the external dictionary memory contained in the compressed representation, and a second dictionary decoder having an internal dictionary memory, the second dictionary decoder that at least partially decompresses at least a part of the compressed representation by extracting, from the internal dictionary memory, portions of pattern data corresponding to references to the internal dictionary memory contained in compressed representation.

18 Claims, 5 Drawing Sheets

U.S. PATENT DOCUMENTS

| | | | |
|---|---|---|---|
| 6,683,547 B2 * | 1/2004 | Border et al. | 341/106 |
| 6,687,041 B1 | 2/2004 | Sandstrom | |
| 6,747,783 B1 * | 6/2004 | Sandstrom | 359/290 |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| | | |
|---|---|---|
| WO | WO 98/38597 | 9/1998 |

* cited by examiner

LITHOGRAPHIC APPARATUS AND DEVICE MANUFACTURING METHOD UTILIZING A MULTIPLE DICTIONARY COMPRESSION METHOD FOR FPD

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Where a desired dose pattern is to be built up from pixels imaged by an array of individually controllable elements, an initial step in the data processing procedure may be to rasterize the desired dose pattern into a bitmap form. However, when high concentrations of device features are needed, the bitmap form is likely to represent a very large amount of data, which can be difficult and/or expensive to process and/or store.

One approach is to compress the bitmap data, but this presents many challenges, including that of providing hardware capable of online decompression and of dealing with variations in the nature of the requested pattern and its compression/decompression properties. For a given cost of apparatus, it may be necessary to constrain the types of patterns that can be formed and/or accept that highly complex patterns will be produced relatively slower, both of these alternatives representing undesirable limitations for a user of the lithography device.

Therefore, what is needed is a system and method utilizing an improved data compression/decompression system for a lithographic apparatus.

SUMMARY

According to an embodiment of the invention, there is provided a lithographic apparatus comprising an array of individually controllable elements, a compressed-pattern memory, and a dictionary decompressor. The array of individually controllable elements modulates a beam of radiation. The compressed pattern memory stores a compressed representation of a requested dose pattern to be formed on a substrate by the modulated beam. The dictionary decompressor at least partially decompresses the compressed representation. The dictionary decompressor comprises a first dictionary memory and a first dictionary decoder. The first dictionary decoder at least partially decompresses at least a part of the compressed representation by extracting, from the first dictionary memory, portions of pattern data corresponding to references to the first dictionary memory contained in the compressed representation.

According to another embodiment of the invention, there is provided a method of compressing a stream of data representing a requested dose pattern for a lithographic apparatus, comprising the following steps. Analyzing the stream of data in order to identify sequences of data that occur more than once. Selecting a group from the identified repeating sequences of data to encode for later decompression by a dictionary decoder. Forming at least a portion of a compressed representation of the data stream by replacing at least one of the repeating sequences in the group by a reference to a location in a dictionary memory from which an uncompressed version of the repeating sequence will be accessible during decompression by the dictionary decoder.

According to a further embodiment of the invention, there is provided a device manufacturing method comprising the following steps. Providing an array of individually controllable elements that modulate a beam of radiation. Storing a compressed representation of a requested dose pattern to be formed on a substrate by the modulated beam. Reading out and at least partially decompressing at least part of the compressed representation by extracting, from a dictionary memory, portions of pattern data corresponding to references to the dictionary memory contained in the compressed representation.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
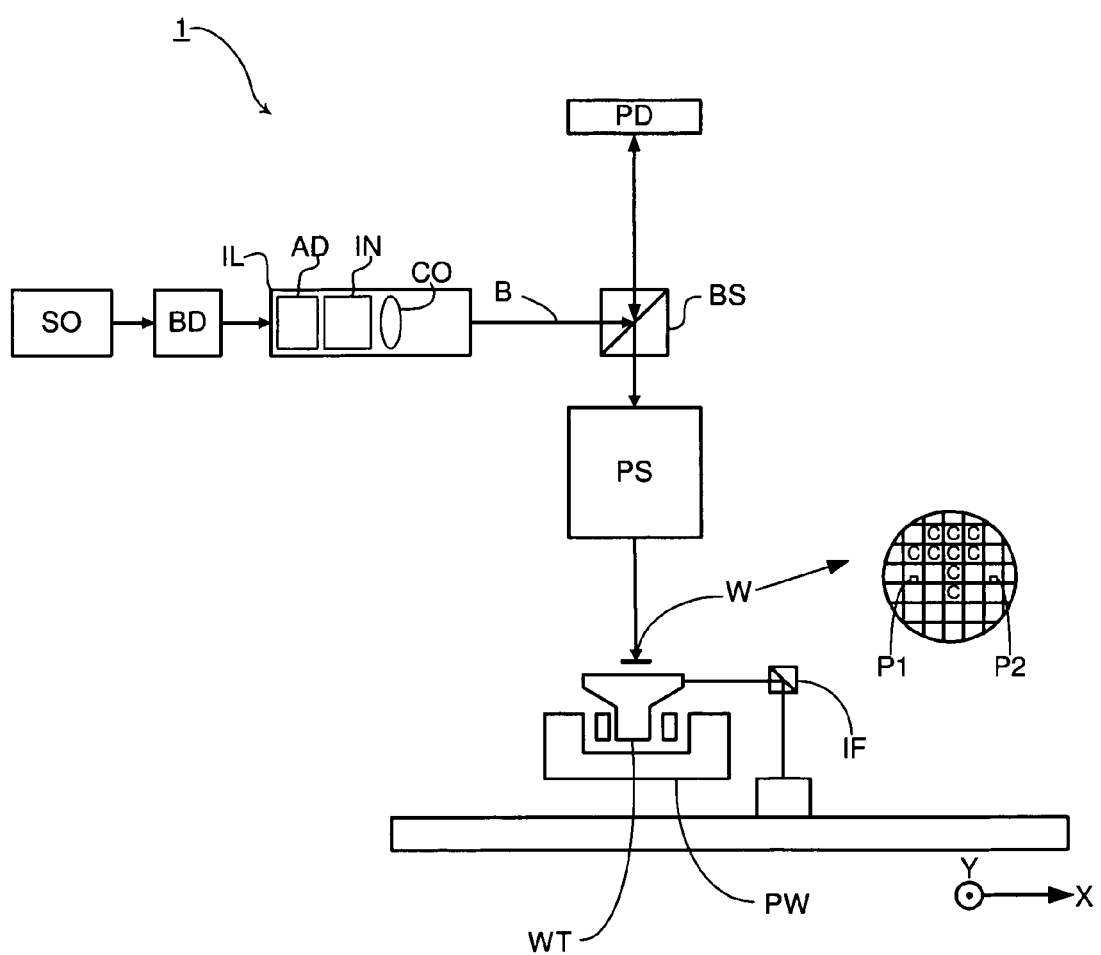
FIGS. 1 and 2 depict lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam can not exactly correspond to the desired pattern in the target portion of the substrate, for example if the pattern includes phase-shifting features or so called assist features. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 3001 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
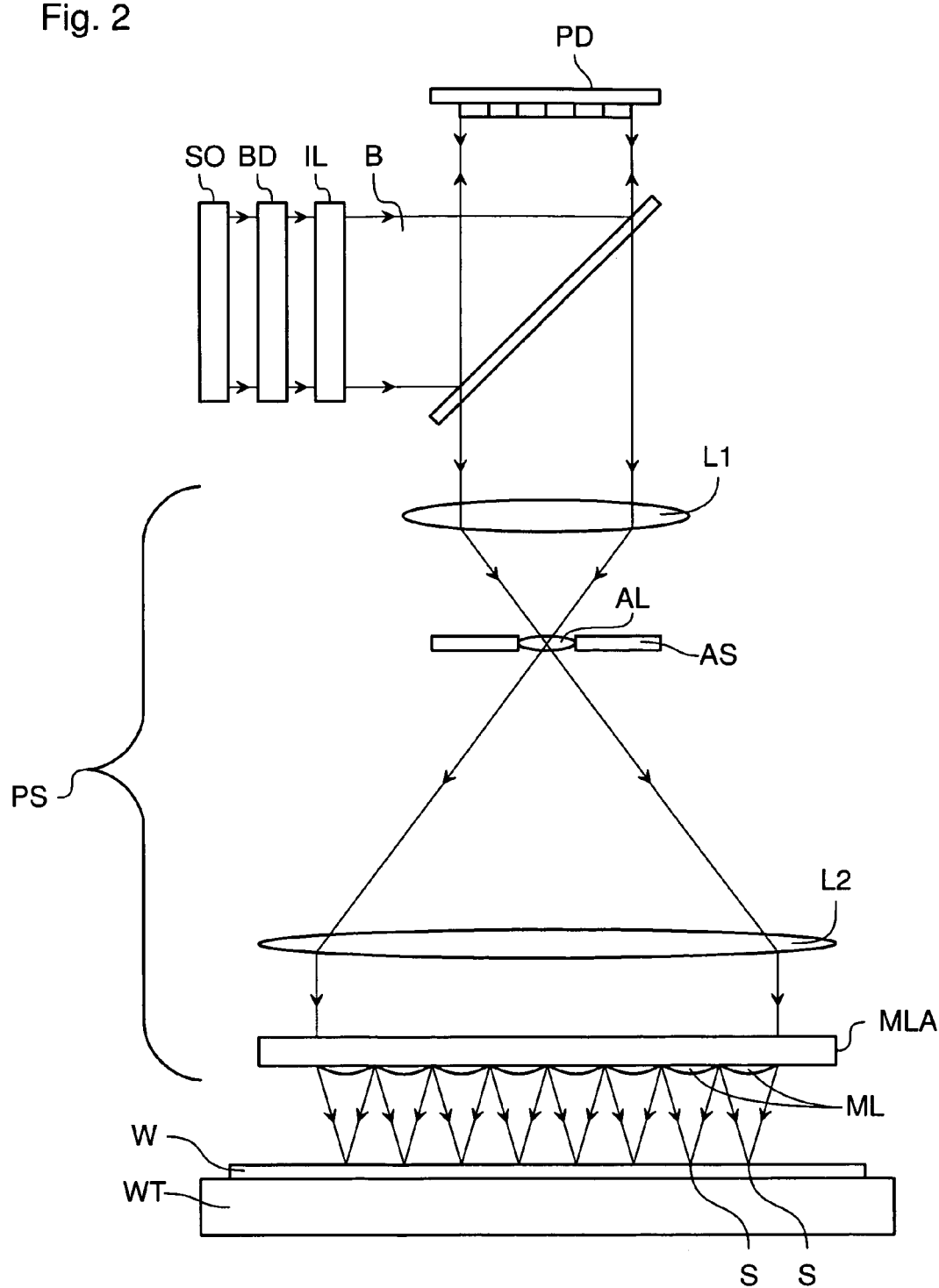

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be movable while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 750, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 can not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes abeam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses MLA are shown, the array of lenses can comprise many thousands of lenses (the same is true of the array of individually controllable elements used as the patterning device PD).

Figure 3:
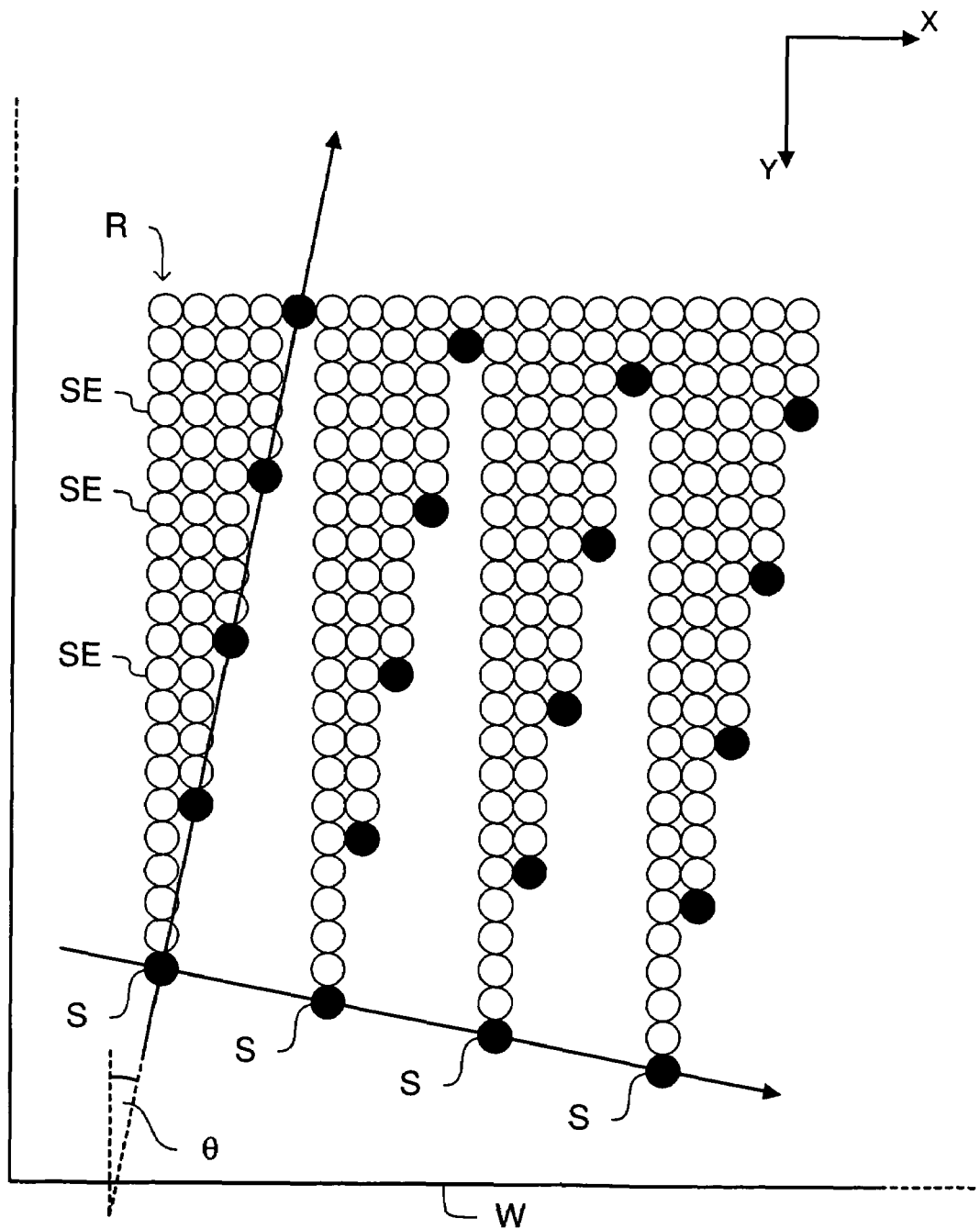
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots S. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
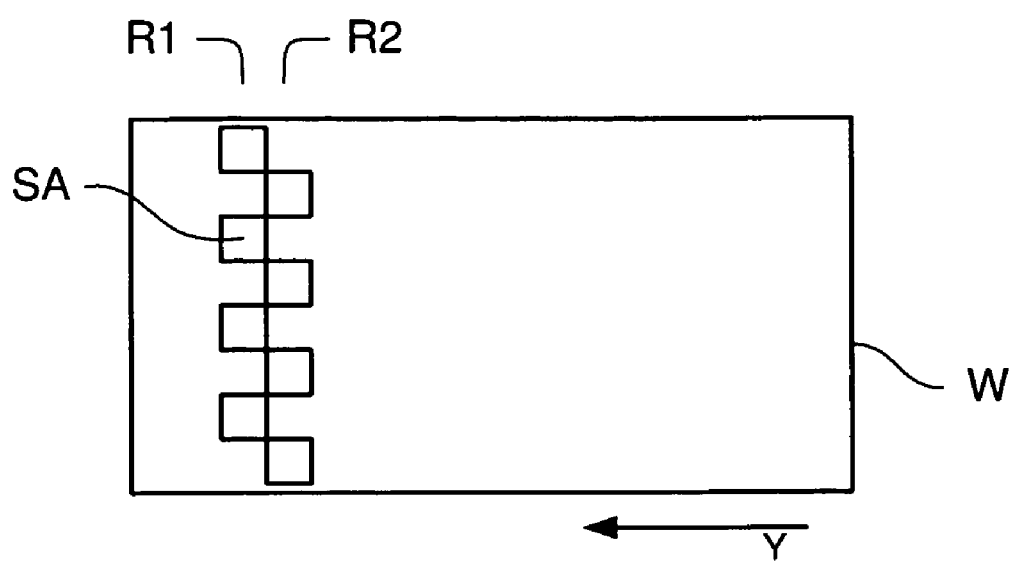
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
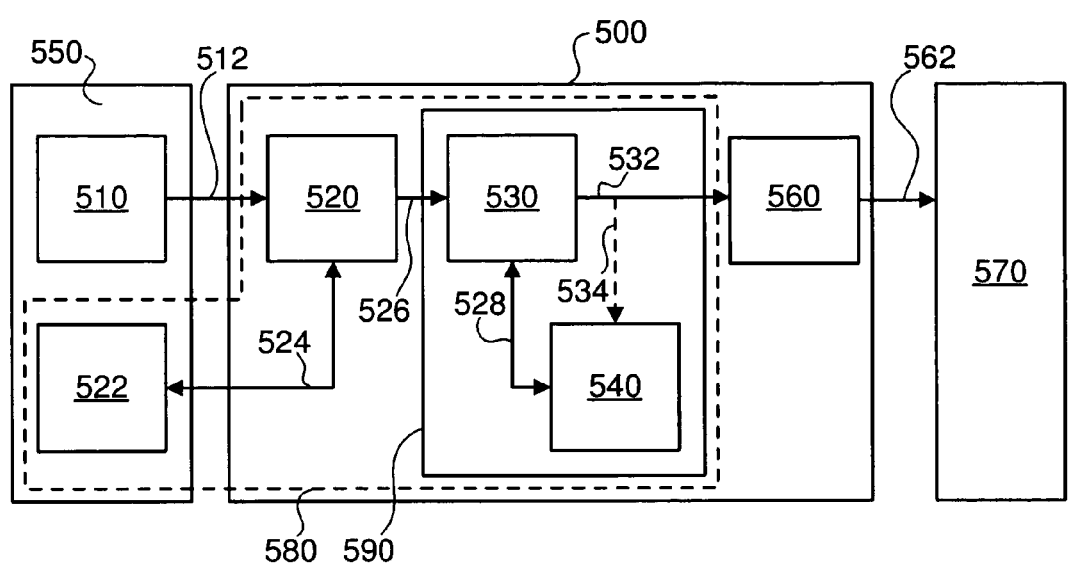
FIG. 5 depicts a decompression device, according to an embodiment of the invention.

According to one embodiment of the invention, for example as shown in FIG. 5, a decompression device is provided that contains hardware elements optimized for different types of patterns. Patterns, such as those associated with LCD displays, can be dealt with efficiently and in a cost-effective manner. The need for vast caches of expensive internal SRAM memory is avoided, for example.

FIG. 5 illustrates a decompression device 500, according to this embodiment of the present invention. The decompression device 500 is arranged to receive compressed requested pattern data stored in pattern memory 510 via data link 512. Decompression is then carried out in several stages.

The first two stages are carried out by a dictionary decompressor 580. In one example, dictionary decompressor 580 comprises two dictionary-based decoders: a global dictionary decoder 520 and a local dictionary decoder 590. The use of two decoders allows the pattern (e.g., border areas and display areas in patterns for LCD displays) to be dealt with in a more efficient way because the hardware for each can be optimized for different aspects of the overall pattern, which is described in more detail below.

In one example, dictionary-based compression and decompression rely on references to patterns (or sequences of data corresponding to patterns or to parts of patterns) stored in a memory (e.g., the "dictionary"). In the compression stage, a dictionary-based algorithm keeps a history of patterns that have passed by in the memory and checks for repeating patterns. When a repeating pattern occurs, a symbol is created that comprises a reference to the location in the memory where the pattern has occurred in the past. The symbol is usually much smaller than the repeating pattern and therefore provides a degree of compression. For pattern features that are repeated often, this method provides a high compression factor. Decompression may be carried out by reversing the process.

In one example, the global dictionary decoder 520 is configured to interact with a global dictionary memory 522 (e.g., a global dictionary) via data link 524, which is implemented in an external memory block 550. In the embodiment shown, the memory block 550 also contains the pattern memory 510, but the pattern memory 510 may also be implemented in a separate memory block. The memory block 550 is external in the sense that it does not form an integral part of the decompression device 500. For example, where the decompression device is embodied in one or more FPGA chips, the memory block does not form an integral part of the FPGA chips. The memory block 550 may be connected via high bandwidth connections to the decompression device 500.

The global dictionary 522 stores pattern features that are large compared with the overall requested pattern and/or features that repeat over relatively large distances (so that they only need to be "accessed", in the sense of being entirely "read" from the dictionary, less frequently in the decoding process). Each of the features is stored at specific locations in the dictionary and may be indexed by means of a memory address, for example.

In one example, smaller "local" features are not represented in the global dictionary 522 because they may be more efficiently dealt with by means of the local dictionary 540, which can be optimized for the types of memory access operations associated with such local features (see below).

In one example, the global dictionary may be configured to store all those repeating features that are: (1) too large to fit into the local dictionary or (2) are repeated with a separation pattern (i.e., the pattern occurring in the space between repeating instances of the repeating pattern in question) which, when added to the size of the repeating feature, is larger than the local dictionary.

In one example, the portion of the decompression process performed by the global dictionary decoder 520 is as follows. Data is read from pattern memory 510 and, where the data makes reference to the global dictionary 522, the global dictionary decoder 520 extracts the referenced data from the global dictionary 522 and passes this to the output link 526.

Data that makes no reference to the global dictionary 522 is passed straight to the output link 526.

The global dictionary decoding step is particularly effective for regions of the pattern that make references to large entries in the global dictionary 522, i.e., to regions containing relatively large repeating pattern features and/or to pattern features that repeat over large distances. For example, the display pixels in the pattern for an LCD display, large repeating patterns in the border areas, and/or serial numbers and titling information are dealt with efficiently by this step.

In one example, the external memory block 550 comprises SDRAM (synchronous DRAM), a higher speed version of standard DRAM. This type of memory is particularly suited to storing global dictionary entries because it is relatively cheap (so that a high capacity can be provided for reasonable cost) and the memory bandwidth is utilized most effectively to refer to larger blocks of pixels (e.g., bitmap pixel blocks of at least several hundred pixels). Referencing small pixel blocks with this kind of memory results in very poor memory bandwidth utilization because it is relatively inefficient to transfer small blocks of data (many parallel memories may end up being required to achieve the same bandwidth). For example, a typical SDRAM device may provide a comparatively high data bandwidth if datablocks containing more than 100 bytes (from adjacent memory addresses) are accessed. However, if the size of the datablocks is reduced to less than 8 bytes, the data bandwidth might be expected to fall by around a factor of 10, requiring, therefore, 10 times more memory devices to obtain the same bandwidth as is achieved when transferring the larger blocks. An important characteristic of the external memory is that it has a high bandwidth, but random access is not necessarily required.

In one example, it is possible to efficiently reference small pixel blocks by using the FPGA internal SRAM memory, which has a much shorter access time than the external memory and is therefore more suitable for implementing the local dictionary 540. It may be implemented with both a high bandwidth and random-access capability. The amount of SRAM memory available is much more restricted but does not need to be very great if designed only to deal with small repeating patterns that repeat over small distances. However, the local dictionary should be made large enough to capture a significant proportion of the pattern regularity (repetition). In a flat panel display, for example, the local dictionary should be made large enough to capture at least smaller scale regularity in the display area pattern. In one example, the contents of the local dictionary may be updated in a dynamic fashion so as to improve the relevance of the dictionary. For example, the dictionary may be configured only to store data that has been recently output from the dictionary decoder 590. More details regarding this embodiment are given below.

The local dictionary decoder 590 is provided as an additional decompression stage, specifically designed to deal with locally repeating features of the pattern. In the embodiment shown, the decoder 590 comprises a decoding/calculating part 530 and a local dictionary memory 540 (or "local dictionary"). Decoding/calculating part 530 is coupled to local dictionary memory via link 528. In the embodiment shown, the local dictionary decoder 590 is arranged to receive the output of the global dictionary decoder 520 as input. It is to be appreciated that the global and local decoders 520 and 590 could also be arranged in the opposite order with the output of the local dictionary decoder 590 being received as input by the global dictionary decoder 520 but this may lead to an inferior compression ratio.

In this example, the local dictionary decoder 590 works by making frequent accesses to small amounts of data stored in a local dictionary 540. As mentioned above, good use of the capacity of the local dictionary 540 may be achieved by varying the contents of the local dictionary 540 during decompression. One way in which this may be achieved is by arranging for the dictionary to be updated in a "sliding window" mode. According to this arrangement, instead of storing repeating pattern data for the entire requested pattern, the local dictionary 540 only stores data relating to a portion of the requested pattern contained within a notional "window," which is arranged to "slide" over the pattern, following the region of the pattern that is being decompressed. In this mode, the local dictionary decoder 530 relies on the fact that small pattern features often tend to repeat over short distances, from scan-line to scan-line, for instance. This repetition can therefore be coded using references to dictionary addresses that are physically very close together and which represent recently processed data.

One way in which the "sliding window" mode may be implemented is to arrange for the output from the local dictionary decoder 530 to be used as the input for the local dictionary memory 540. As mentioned above, the size of the local memory 540 is limited and only a portion of the cumulative output from the local decoder 530 can be stored at any one time. This may be controlled on a "first-in-first-out" principle, for example, which may be implemented using specialist memory hardware ("first-in-first-out" memory) or using more conventional memory. In this way, only a portion of the decoder output that has been most recently processed will be stored in the memory 540.

The proportion of the data that is retained in the local dictionary memory 540 may be varied using the controllable link 534, for example. In particular, the controllable link 534 can be arranged to make use of the fact that data that is not going to be re-used at a later stage in the decompression process need not be stored in the local dictionary memory 540. For example, the compression process may be designed so that extra bits of data (or "markers") are inserted (or otherwise generated) into the data stream to be decompressed to indicate which (local dictionary suitable) features are going to be repeated later on in the decompression processing and which are not going to be repeated (or which are too large or otherwise unsuitable for storing in the local dictionary 540). The controllable link 534 is then configured to forward to the local dictionary 540 only those portions of the data that are actually going to be used by the local decoder 590. In this way, better use is made of the local dictionary 540 so that larger repeating features may be stored and/or older repeating features can be kept longer in memory. This then means that the "size" of the local dictionary 540 in terms of a proportion of the output stream 532 is no longer constant, but varies depending on the extent of local repetition in the data stream.

As an alternative, all of the data output from the local decoder 590 may be passed to the local dictionary 540 (this would correspond to having link 534 passing all data). This arrangement requires less sophisticated compression techniques (it is no longer necessary to mark repeating data in the same way) and may also be simpler to implement in hardware.

According to one example, where a repeating local feature occurs, a first instance of the feature will be provided in the input data stream in a relatively uncompressed form (i.e., it does not comprise a reference to another dictionary—but it may still be run-length encoded, for example) and will be available to act as a reference for the time that it is retained in the local dictionary 540. Further instances of this feature are encoded simply by referencing an earlier occurrence in the local dictionary 540 and are imported into the data stream output from the local decoder 540 as and when they occur. Any instance of the same repeating local feature that occurs after all uncompressed forms of that feature have passed out of the local dictionary (or, at least, are no longer available in their entirety) will need to be encoded using another relatively uncompressed version of the feature and references may be made to that second reference feature for as long as it is in the local dictionary etc. In the situation where multiple versions of the same repeating feature exist in the internal memory, reference may be made to the most recent and/or to the most easily accessible.

In one example, the input data stream 526 to the local decoder 530 contains references to the local dictionary 540, but the output data stream 532, and thus the contents of the local dictionary 540, does not contain references to the local dictionary any more and is simply run-length (or otherwise) encoded data to be decoded by decoder 560.

As has been mentioned above, the portion of the requested pattern that is represented by data in the local dictionary 540 may be delimited by a "window" that can be visualized as "sliding" over the representation of the requested dose pattern that is to be input to the final decoder 560 (e.g., when the final decoder 560 is capable of run-length decoding, the window will slide over a run-length encoded representation of the requested dose pattern). As has been mentioned above, the size and geometry of this window may vary where a controllable link 534 is provided to ensure, for example, that the local dictionary 540 only ever contains data that is actually going to be referenced. In one example, the window may be configured to store a fixed number of "tokens", which each correspond to a portion of the pattern (defined by a single pixel or by entire lines of pixels, for example). The number of tokens and the size of each individual token then determine the total size of the window data, which must be storable in the local dictionary memory 540.

In the case where the controllable link 534 is configured to pass all of the data output from the local dictionary decoder 530 to the local dictionary 540, the compression software for forming the compressed representation of the requested dose pattern will be configured to replace a repeating sequence of data by references to data stored in the local dictionary 540. This can occur whenever the following inequality is satisfied: $A+B \leqq S$, where A is the amount of memory required to store the sequence of data in question (in a relatively uncompressed form, e.g., a form which does not require further decoding by either the local or global dictionary decoders, but which may be subject to further decompression by decoder 560), B is the amount of memory taken up by data occurring in the output from the local decoder 530 between the reference version of the sequence of data and the repeating occurrence (e.g., between a previous occurrence and the sequence to be compressed by replacement with a reference to the previous occurrence), and S is the capacity of the local dictionary 540. The relation embodies the requirement that it is only helpful to make reference to a repeating feature if a version of that feature is accessible (in its entirety) in the local dictionary 540. Large repeating features and/or features that do not repeat closely enough (i.e., that are not nearby in the requested pattern or in a run-length encoded or otherwise compressed representation of the requested pattern), such that the above inequality is not satisfied, may be stored in the global dictionary and be decoded by the global dictionary decoder.

In the case where the controllable link 534 is configured only to pass sequences of data to the local dictionary 540 that will be referenced by the local decoder 530, the relation for determining whether or not a repeating sequence of data can be replaced by a reference to the dictionary memory 540 becomes more relaxed. For example, $A+B' \leqq S$, where $B'<B$, thus increasing the scope of this form of compression.

Both the local and global decoders discussed above require that the pattern data be compressed in an appropriate way. For the local dictionary decoder 590, for example, the encoding process may need to take account of the size of the sliding window and, possibly, the operation of the global dictionary decoder so as to ensure that references to memory addresses in the local dictionary memory 540 point to the intended decompressed feature. In addition, as mentioned above, data may need to be inserted into each token to indicate whether the token should be passed into the local dictionary memory 540 (i.e., to control the operation of the controllable link 534).

In one example, the encoding (compression) process can be implemented as a two-stage process, so as to be the inverse of the decoding (decompression) process. First, an encoding of the required output on 532 is constructed as if only the local dictionary encoder 590 is present. This is the stream that is to be delivered over 526. In the second pass, this is encoded for the global dictionary encoder 580, and this then gives the encoded stream that must be stored in 510 and delivered over 512. Where a final decoder 560 is present then a first stage will be the encoding of the pattern data into compressed form that corresponds with the capability of the decoder 560. In order for the encoder to perform the above in an optimal way, it should be provided with information about the characteristics of the decompression hardware (e.g., memory sizes, memory bandwidth characteristics, etc.).

As an alternative to the above encoding order, it may be advantageous to encode the data for the global dictionary decoder first so that use can be made of hierarchy in the GDSII (or equivalent) vector-based representation of the requested dose pattern supplied by the user. This may significantly reduce the encoding time. Where a final decoder 560 is present, the encoding process would next deal with the encoding corresponding to the final decoder 560 and finish with the encoding in respect of the local dictionary decoder 590.

The performance of the local dictionary decoder 590 and/or global dictionary decoder 520 may be improved further by pre-processing the pattern data to perform an initial compression before the dictionary decoders 590 and 520 process it. Decoding can be implemented, as mentioned above, by including an additional decoder 560 in the decompression device 500, after the dictionary decoders. The pre-processing technique(s) may be chosen to facilitate easy online decompression. Run-length encoding or similar may be used, for example. Additionally or alternatively, a Huffman encoding (a static dictionary type encoding), a delta encoding, a dictionary-based encoding, or any combination of these methods, may be used.

In the example decoder shown in FIG. 5, a run-length decoder 560 is provided, which is arranged to receive the signal output after decoding by both the local and global dictionary decoders 590 and 520, via data link 532. By only having to output data in run-length encoded form, the size of the local and global dictionaries 540 and 522 respectively can be reduced for a given number of entries. Memory access operations may therefore be carried out more effectively or, in the case of the local dictionary, for example, the size of the sliding window may be increased to take account of a larger portion of the requested dose pattern and, therefore, a greater proportion of the pattern regularity.

For example, the patterns in the border regions or periphery of flat panel display patterns are relatively large (i.e., they are irregular over relatively large length scales) and will not generally fit into a reasonably sized local dictionary 540. However, pre-processing of the type discussed above can often make this possible because of the types of pattern frequently encountered in these regions. For example, run-length encoding can be particularly effective at reducing the data size of adjacent pixels with the same gray tone and it is common to see many of these (in the order of dozens, for example) in the periphery regions. As mentioned above, the local dictionary 540 can also be used to store pattern data relating the display areas of flat panel display patterns.

The output of the final decompression stage 560 is forwarded via data-link 562 to external memory 570. The memory 570 may be arranged to output data at a constant rate to later stages of the data-path, the memory size being chosen to allow compensation for small variations in the output rate from the decompression device 500.

Although specific reference can have been made above to the use of embodiments of the invention in the context of optical lithography, it will be appreciated that the invention can be used in other applications, for example imprint lithography, where the context allows, and is not limited to optical lithography. In imprint lithography topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
    an array of individually controllable elements that modulate a beam of radiation;
    a compressed pattern memory that stores a compressed representation of a requested dose pattern to be formed on a substrate by the modulated beam; and
    a dictionary decompressor that at least partially decompresses the compressed representation, wherein the dictionary decompressor comprises
        a first dictionary memory that is an external dictionary memory,
        a first dictionary decoder that at least partially decompresses at least a part of the compressed representation by extracting, from the first dictionary memory, portions of pattern data corresponding to references to the first dictionary memory contained in the compressed representation, and
        a second dictionary decoder, having an internal dictionary memory, that at least partially decompresses at least a part of the compressed representation by extracting, from the internal dictionary memory, portions of pattern data corresponding to references to the internal dictionary memory contained in the compressed representation,
    wherein the requested dose pattern comprises two groups of repeating pattern features; and
    the dictionary decompressor is configured so that:
        the external dictionary memory stores pattern data corresponding to a first of the groups, and
        the internal dictionary memory stores pattern data corresponding to a second of the groups, wherein the repeating pattern features in the first group are larger than the repeating pattern features in the second group.

2. The lithographic apparatus of claim 1, further comprising:
    a controllable link that forwards at least a portion of the data decompressed by the second dictionary decoder to the internal dictionary memory, wherein the controllable link forwards only those parts of the decompressed data that correspond to features that are to be extracted by the second dictionary decoder later in the decoding process.

3. The lithographic apparatus of claim 2, wherein the controllable link selects parts of the decompressed data to forward to the internal dictionary memory on the basis of markers in the data input to the second dictionary decoder for decompression, the markers indicating which sequences of data will be extracted by the second dictionary decoder later in the decoding process.

4. The lithographic apparatus of claim 1, wherein: the first and second dictionary decoders are implemented using at least one Field Programmable Gate Array; the internal dictionary memory is implemented in memory that is integral with the at least one Field Programmable Gate Array; and the external dictionary memory is implemented in memory that is formed separately from the at least one Field Programmable Gate Array and connected via a communication interface.

5. The lithographic apparatus of claim 1, wherein the external dictionary memory is implemented using Synchronous Dynamic Random Access Memory.

6. The lithographic apparatus of claim 1, wherein the internal dictionary memory is implemented using Static Random Access Memory.

7. The lithographic apparatus of claim 1, wherein content of at least one of the dictionary memories changes according to a region of the requested pattern being processed by the dictionary decompressor.

8. The lithographic apparatus of claim 7, wherein at least one of the dictionary memories is progressively updated by storing subsequent portions of output from at least one of the dictionary decoders.

9. The lithographic apparatus of claim 7, wherein output from the first dictionary decoder forms an input for the second dictionary decoder and the internal dictionary memory is progressively updated by storing subsequent portions of the output from the second dictionary decoder.

10. The lithographic apparatus of claim 7, wherein the at least one of the dictionary memories is progressively updated by importing data from an external memory device.

11. The lithographic apparatus of claim 7, wherein content of at least one of the dictionary memories includes data relating to a portion of the requested pattern, the portion corresponding to a region of the requested pattern that has been most recently processed.

12. The lithographic apparatus of claim 11, wherein the portion of the requested pattern is delimited by a window of a substantially predetermined size, which is smaller than the requested dose pattern, and wherein the window is moved during decompression so as to contain only the region of the pattern most recently processed.

13. The lithographic apparatus of claim 1, wherein:
the dictionary decompressor outputs partially compressed data in at least one of the following forms: run-length encoded data, Huffman encoded data, delta encoded data and dictionary-based encoded data; and
the lithographic apparatus further comprises at least one of the following: a run-length decoder, a Huffman decoder, a delta decoder and a dictionary-based decoder, each arranged at least partially to decode the partially compressed data.

14. A device manufacturing method, comprising:
providing an array of individually controllable elements that modulate a beam of radiation;
storing a compressed representation of a requested dose pattern to be formed on a substrate by the modulated beam, wherein the requested dose pattern comprises two groups of repeating pattern features; and
reading out and at least partially decompressing at least part of the compressed representation by extracting, from a dictionary memory including an external dictionary memory and an internal dictionary memory, portions of pattern data corresponding to references to the dictionary memory contained in the compressed representation, wherein the external dictionary memory stores pattern data corresponding to a first of the groups, and the internal dictionary memory stores pattern data corresponding to a second of the groups, wherein the repeating pattern features in the first group are larger than the repeating pattern features in the second group.

15. A flat panel display manufactured according to the method of claim 14.

16. An integrated circuit device manufactured according to the method of claim 14.

17. The lithographic apparatus of claim 1, wherein a radiation dose in the dose pattern above a dose threshold causes an area of a substrate exposed to the radiation dose to develop a layer or resist, such that the area of the substrate exposed to the radiation dose is protected from etching by the resist.

18. The lithographic apparatus of claim 1, wherein a radiation dose in the dose pattern below a dose threshold causes an area of a resist exposed to the radiation dose to be removed.

* * * * *